United States Patent
Chen

(10) Patent No.: US 10,096,740 B1
(45) Date of Patent: Oct. 9, 2018

(54) METHOD FOR MANUFACTURING COLOR MICRO LIGHT-EMITTING DIODE ARRAY SUBSTRATE

(71) Applicant: Shenzhen China Star Optoelectronics Technology Co., Ltd., Shenzhen (CN)

(72) Inventor: Lixuan Chen, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/551,285

(22) PCT Filed: Jun. 20, 2017

(86) PCT No.: PCT/CN2017/089265
§ 371 (c)(1),
(2) Date: Aug. 16, 2017

(30) Foreign Application Priority Data

May 23, 2017 (CN) .......................... 2017 1 0370194

(51) Int. Cl.
*H01L 33/00* (2010.01)
*H01L 27/15* (2006.01)
*H01L 33/36* (2010.01)

(52) U.S. Cl.
CPC .......... *H01L 33/005* (2013.01); *H01L 27/156* (2013.01); *H01L 33/36* (2013.01)

(58) Field of Classification Search
CPC ...... H01L 33/005; H01L 27/156; H01L 33/36
See application file for complete search history.

(56) References Cited

U.S. PATENT DOCUMENTS

2017/0179097 A1* 6/2017 Zhang .................... H01L 25/50

FOREIGN PATENT DOCUMENTS

| CN | 103441101 A | 12/2013 |
|---|---|---|
| CN | 105723528 A | 6/2016 |
| CN | 105870265 A | 8/2016 |
| WO | WO2016100657 A2 | 6/2016 |

* cited by examiner

*Primary Examiner* — Karen Kusumakar
(74) *Attorney, Agent, or Firm* — Leong C. Lei

(57) ABSTRACT

The present invention provides a method for manufacturing a color micro LED array substrate, in which a plurality of monochromic micro LED arrays of different colors are formed on a receiving substrate to form a color micro LED array, wherein making of the monochromic micro LED array of each of the colors is conducted in combination with a bonding technique and a laser lift-off technique and metal electrodes are selectively formed on the micro LEDs in a specific zone of the supply substrate so that the micro LEDs in the specific zone can be selectively bonded to the receiving substrate and laser irradiation is selectively made on the micro LEDs in the specific zone to allow the micro LEDs of the specific zone, after the bonding and laser annealing, to separate from the supply substrate to thereby form the monochromic micro LED array on the receiving substrate to realize fabrication of monochromic micro LED arrays of different colors on the receiving substrate, and the method of fabrication is easy to carry out.

18 Claims, 4 Drawing Sheets

METHOD FOR MANUFACTURING COLOR MICRO LIGHT-EMITTING DIODE ARRAY SUBSTRATE

BACKGROUND OF THE INVENTION

1. Field of the Invention

The present invention relates to the field of display technology, and more particular to a method for manufacturing a color micro light-emitting diode (LED) array substrate.

2. The Related Arts

A micro light-emitting diode (LED) is a device having a size between several microns and hundreds of microns. Since it is much smaller than regular LEDs in size, it becomes possible to use a single LED to serve as a pixel for displaying purposes. A micro LED display is a display device that displays an image with a display pixel array that is made up of a high-density arrangement of micro LED array, which, similar to a large scale outdoor LED display panel, allows each of the pixels to be addressable and individually drivable for light emission and can be considered as a miniature version of the outdoor LED display panel, wherein pixel distance is reduced from the order of millimeters to the order of microns. The micro LED display, similar to an organic light-emitting diode (OLED) display, is a self-luminous display, but compared to the OLED display, the micro LED display shows advantages, such as better material stability, extended life span, and being free of burn-in, and is considered the most powerful competitor of the OLED display.

In consideration of lattice match, the micro LED device must be first grown, through molecular beam epitaxy, on a supply substrate, and followed by application of laser lift-off (LLO) technology to separate a micro LED bare chip from the supply substrate to be subsequently transferred, through micro transfer print (NTP), to a receiving substrate that is formed, in advance, with a circuit pattern, to form a micro LED array, which can be used to make a micro LED display panel. The basic principle of NTP is generally as follows. A transfer head that comprises a pattern, such as a polydimethylsiloxane (PDMS) transfer head having a projection structure, is used to pick up the micro LED bare chip from the supply substrate by means of a PDMS transfer layer that is adhesive, and then, the PDMS transfer head and the receiving substrate are aligned with each other, followed by having the micro LED bare chip that is picked and held by the PDMS transfer head attached to a predetermined location on the receiving substrate and then having the PDMS transfer head separated from the receiving substrate to complete the transfer of the micro LED bare chip and form a micro LED array substrate.

Thus, in the process of using the micro transfer print technique to manufacture a micro LED array, the transfer head must be used to transfer the micro LED array. The transfer head has a structure that is relatively complicated, and in addition, reliability thereof must be taken into consideration. Making the transfer head requires additional expenditures. Before the transfer head can pick up a micro LED, phase change is necessary and the thermal budget of the micro LED for phase change is limited and is often less than 350° C., or more specifically, less than 200° C., otherwise, the performance of the micro LED deteriorates. Further, two transfer operations are necessary in the process of manufacturing the micro LED array, namely transferring from the supply substrate to the transfer head and transferring from the transfer head to the receiving substrate.

In view of the problems present in micro transfer printing conducted with a transfer head, a chip bonding technique has been proposed in this field to carry out transfer of a micro LED array, wherein a supply substrate that supplies micro LEDs is set in direct alignment and bonding with a receiving substrate so that intermediate steps involving a transfer head are eliminated. This solution, however, is difficult in realizing colorization of an LED display array for micro LEDs grown on a specific supply substrate are all of one same color so that the micro LED array bonded to the receiving substrate are one color only and thus can do monochrome displaying only, such as blue color displaying, and it is not possible to realize an arrangement of micro LEDs of multiple colors for color displaying, such as alternate arrangement of micro LEDs of three colors of red, green, and blue. Further, the size of the supply substrate is generally 2-4 inches currently, so that the number of micro LEDs that can be transferred in one transfer operation is limited.

SUMMARY OF THE INVENTION

An objective of the present invention is to provide a method for manufacturing a color micro light-emitting diode (LED) array substrate, which allows for selective transfer of micro LEDs of supply substrates of different colors to a receiving substrate to form monochromic micro LED arrays of different colors so as to realize fabrication of a color micro LED array substrate.

To achieve the above objective, the present invention provides a method for manufacturing a color micro LED array substrate, wherein the color micro LED array substrate comprises a receiving substrate and a color micro LED array arranged on the receiving substrate; the receiving substrate comprises a plurality of monochromic pixel zones respectively corresponding to different colors, the color micro LED array comprising a plurality of monochromic micro LED arrays of different colors, the monochromic micro LED array of each of the colors being arranged in one of the monochromic pixel zones corresponding to the color;

wherein a process for making the monochromic micro LED array of each color of the color micro LED array substrate comprises the following steps:

Step S1: providing a supply substrate corresponding to a selected color and a receiving substrate, wherein the supply substrate is provided with a plurality of micro LEDs of the selected color; defining a to-be-transferred zone on the supply substrate to correspond to the monochromic pixel zone of the receiving substrate that corresponds to the selected color and defining the micro LEDs located in the to-be-transferred zone of the supply substrate as micro LEDs to be transferred, and forming metal electrodes on each of the micro LEDs to be transferred, wherein each of the monochromic pixel zones of the receiving substrate is provided with a plurality of driving electrodes;

Step S2: aligning the supply substrate and the receiving substrate with each other such that the metal electrodes of each of the micro LEDs to be transferred are positioned above and corresponding to the driving electrodes in the monochromic pixel zone of the receiving substrate corresponding to the selected color to allow the metal electrodes of each of the micro LEDs to be transferred to couple to the driving electrodes so as to have the micro LED to be transferred bonded to the monochromic pixel zone of the receiving substrate that corresponds to the selected color; and Step S3: conducting laser irradiation on all the micro LEDs to be transferred among the plurality of micro LEDs on the supply substrate so as to have all the micro LEDs to be transferred separated from the supply substrate and fixed to the monochromic pixel zone that corresponds to the selected color to complete making of the monochromic micro LED array of the color.

In Step S3, a large-area laser source is used, in combination with a mask plate to subject the plurality of micro LEDs to selective irradiation, so that only the micro LEDs to be transferred are subjected to laser irradiation.

In Step S3, a plurality of fixed-direction laser sources are used to subject the plurality of micro LEDs to selective irradiation, wherein the plurality of fixed-direction laser sources are set to correspond to the micro LEDs to be transferred of the supply substrate so that only the micro LEDs to be transferred are subjected to laser irradiation.

In Step S1, a photolithographic operation is applied to form the metal electrodes on each of the micro LEDs to be transferred.

In Step S2, the plurality of driving electrodes are provided thereon with low melting point solder pads.

In Step S2, a process for bonding the micro LED to be transferred to the receiving substrate comprises: with the micro LED to be transferred being positioned on the driving electrodes, implementing heating treatment to have the low melting point solder pads of the driving electrodes melted so as to couple the metal electrodes of the micro LED to be transferred to the driving electrodes thereby bonding the micro LED to be transferred to the monochromic pixel zone of the receiving substrate that corresponds to the selected color.

The monochromic micro LED arrays of the different colors are sequentially formed on the color micro LED array substrate;

wherein a sum of a thickness of the metal electrodes of one of the monochromic micro LED arrays that is made posteriorly and a height of the driving electrodes of the receiving substrate corresponding thereto is made greater than a height of one of the monochromic micro LED arrays that is formed anteriorly on the receiving substrate.

In Step S3, laser irradiation is conducted from the supply substrate side or from the receiving substrate side onto the micro LEDs to be transferred.

The receiving substrate comprises three monochromic pixel zones, and the three monochromic pixel zones are respectively red, green, and blue pixel zones, the color micro LED array correspondingly comprising three monochromic micro LED arrays of different colors, the three monochromic micro LED arrays being respectively red, green, and blue micro LED arrays.

The receiving substrate comprises a thin-film transistor (TFT) array substrate.

The present invention also provides a method for manufacturing a color micro LED array substrate, wherein the color micro LED array substrate comprises a receiving substrate and a color micro LED array arranged on the receiving substrate; the receiving substrate comprises a plurality of monochromic pixel zones respectively corresponding to different colors, the color micro LED array comprising a plurality of monochromic micro LED arrays of different colors, the monochromic micro LED array of each of the colors being arranged in one of the monochromic pixel zones corresponding to the color;

wherein a process for making the monochromic micro LED array of each color of the color micro LED array substrate comprises the following steps:

Step S1: providing a supply substrate corresponding to a selected color and a receiving substrate, wherein the supply substrate is provided with a plurality of micro LEDs of the selected color; defining a to-be-transferred zone on the supply substrate to correspond to the monochromic pixel zone of the receiving substrate that corresponds to the selected color and defining the micro LEDs located in the to-be-transferred zone of the supply substrate as micro LEDs to be transferred, and forming metal electrodes on each of the micro LEDs to be transferred, wherein each of the monochromic pixel zones of the receiving substrate is provided with a plurality of driving electrodes;

Step S2: aligning the supply substrate and the receiving substrate with each other such that the metal electrodes of each of the micro LEDs to be transferred are positioned above and corresponding to the driving electrodes in the monochromic pixel zone of the receiving substrate corresponding to the selected color to allow the metal electrodes of each of the micro LEDs to be transferred to couple to the driving electrodes so as to have the micro LED to be transferred bonded to the monochromic pixel zone of the receiving substrate that corresponds to the selected color; and Step S3: conducting laser irradiation on all the micro LEDs to be transferred among the plurality of micro LEDs on the supply substrate so as to have all the micro LEDs to be transferred separated from the supply substrate and fixed to the monochromic pixel zone that corresponds to the selected color to complete making of the monochromic micro LED array of the color;

wherein in Step S1, a photolithographic operation is applied to form the metal electrodes on each of the micro LEDs to be transferred; and wherein in Step S2, the plurality of driving electrodes are provided thereon with low melting point solder pads.

The efficacy of the present invention is that the present invention provides a method for manufacturing a color micro LED array substrate, in which a plurality of monochromic micro LED arrays of different colors are formed on a receiving substrate to form a color micro LED array, wherein making of the monochromic micro LED array of each of the colors is conducted in combination with a bonding technique and a laser lift-off technique and metal electrodes are selectively formed on the micro LEDs in a specific zone of the supply substrate so that the micro LEDs in the specific zone can be selectively bonded to the receiving substrate and laser irradiation is selectively made on the micro LEDs in the specific zone to allow the micro LEDs of the specific zone, after the bonding and laser annealing, to separate from the supply substrate to thereby form the monochromic micro LED array on the receiving substrate to realize fabrication of monochromic micro LED arrays of different colors on the receiving substrate, and the method of fabrication is easy to carry out.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

The present invention provides a method for manufacturing a color micro light-emitting diode (LED) array substrate. The color micro LED array substrate comprises a receiving substrate 20 and a color micro LED array arranged on the receiving substrate 20. The receiving substrate 20 comprises a plurality of monochromic pixel zones respectively corresponding to different colors. The color micro LED array comprises a plurality of monochromic micro LED arrays of different colors. The monochromic micro LED array of each specific color is arranged in one of the monochromic pixel zones corresponding to the specific color.

Figure 1:
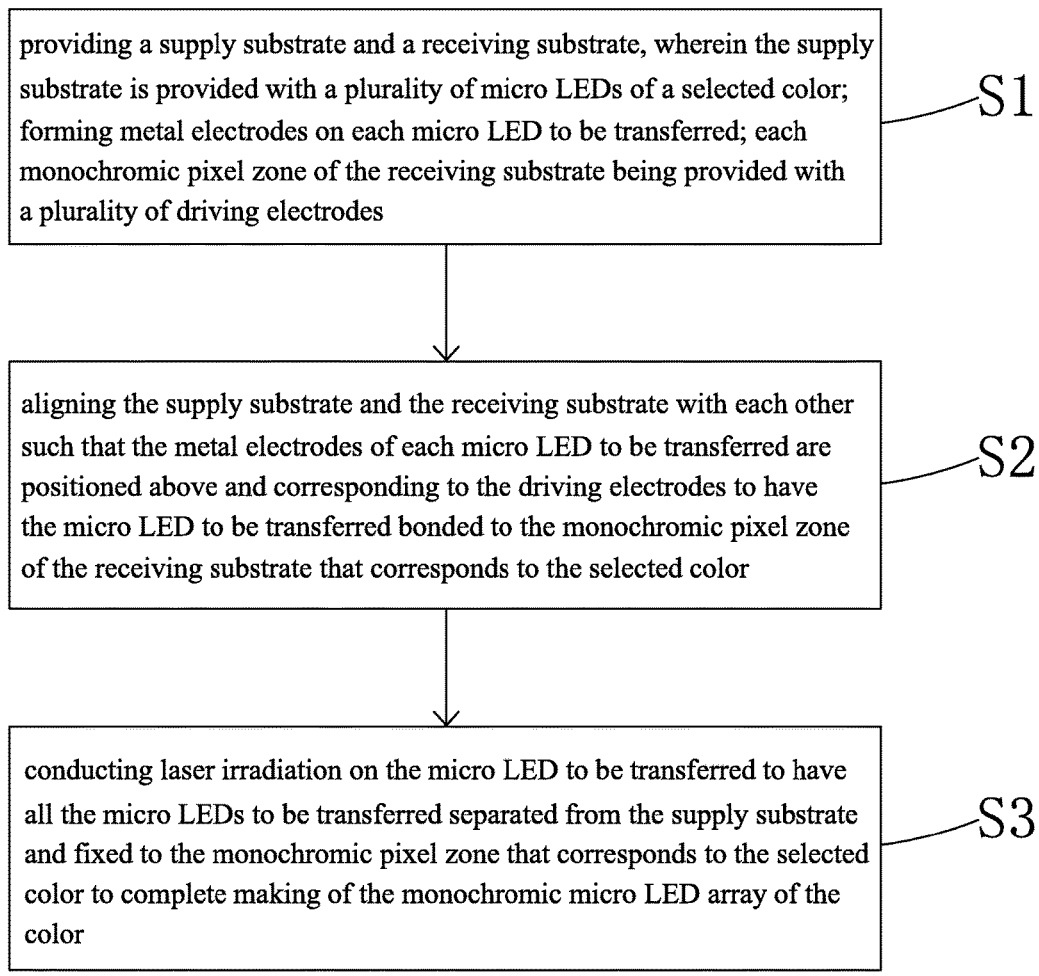
FIG. 1 is a flow chart illustrating a process of making individual monochromic micro light-emitting diode (LED) array in a method for manufacturing a color micro LED array substrate according to the present invention.
Figure 2:
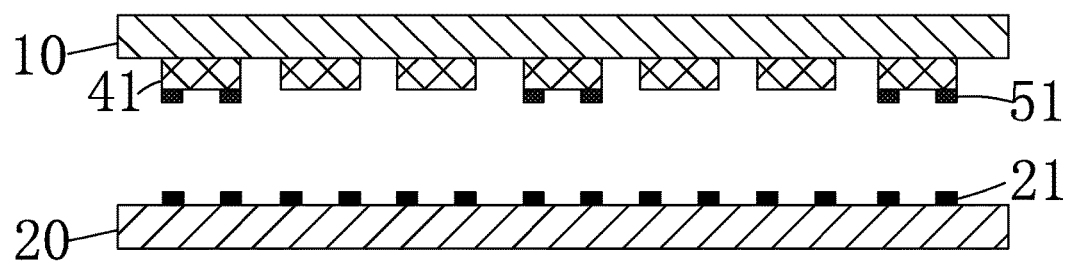
FIG. 2 is a schematic view illustrating Step S1 of the process of making individual monochromic micro LED array in the method for manufacturing a color micro LED array substrate according to the present invention.

Referring to FIG. 1, a process for making the monochromic micro LED array of each of the colors of the color micro LED array substrate comprises the following steps:

Step S1: as shown in FIG. 2, providing a supply substrate 10 corresponding to a selected color and a receiving substrate 20, wherein the supply substrate 10 is provided with a plurality of micro LEDs 41 of the selected color; defining a to-be-transferred zone on the supply substrate 10 to correspond to the monochromic pixel zone of the receiving substrate 20 that corresponds to the selected color and defining the micro LEDs 41 located in the to-be-transferred zone of the supply substrate 10 as micro LEDs to be transferred, and forming metal electrodes 51 on each of the micro LEDs to be transferred.

Each of the monochromic pixel zones of the receiving substrate 20 is provided with a plurality of driving electrodes 21.

Specifically, in Step S1, a photolithographic operation is applied to form the metal electrodes 51 on each of the micro LEDs to be transferred.

Figure 3:
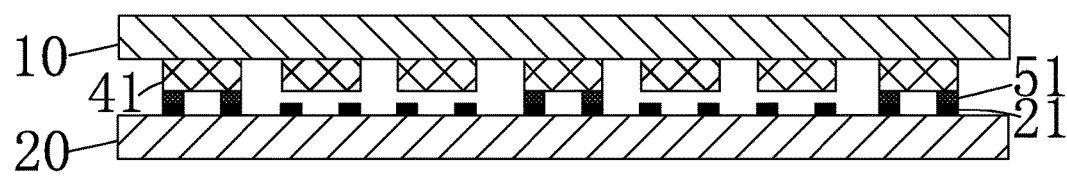
FIG. 3 is a schematic view illustrating Step S2 of the process of making individual monochromic micro LED array in the method for manufacturing a color micro LED array substrate according to the present invention.

Step S2: as shown in FIG. 3, aligning the supply substrate 10 and the receiving substrate 20 with each other such that the metal electrodes 51 of each of the micro LEDs to be transferred are positioned above and corresponding to the driving electrodes 21 in the monochromic pixel zone of the receiving substrate 20 corresponding to the selected color to allow the metal electrodes 51 of each of the micro LEDs to be transferred to couple to the driving electrodes 21 so as to have the micro LED to be transferred bonded to the monochromic pixel zone of the receiving substrate 20 that corresponds to the selected color.

Specifically, in Step S2, the plurality of driving electrodes 21 are provided thereon with low melting point solder pads.

Specifically, in Step S2, a process for bonding the micro LED to be transferred to the receiving substrate 20 comprises: in a condition that the micro LED to be transferred is positioned on the driving electrodes 21, implementing heating treatment to have the low melting point solder pads of the driving electrodes 21 melted so as to couple the metal electrodes 51 of the micro LED to be transferred to the driving electrodes 21 thereby bonding the micro LED to be transferred to the monochromic pixel zone of the receiving substrate 20 that corresponds to the selected color.

Figure 4:
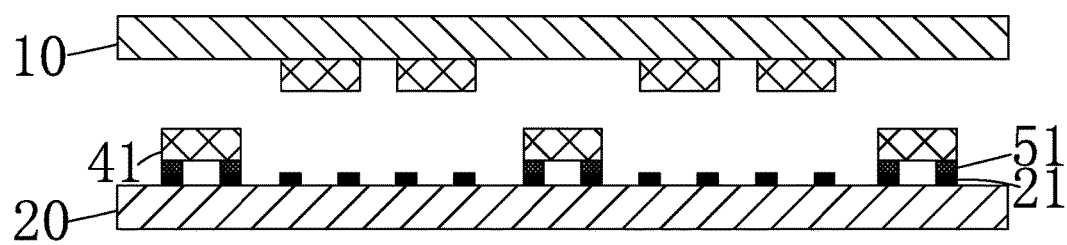
FIG. 4 is a schematic view illustrating Step S3 of the process of making individual monochromic micro LED array in the method for manufacturing a color micro LED array substrate according to the present invention.

Step S3: as shown in FIG. 4, conducting laser irradiation on all the micro LEDs to be transferred among the plurality of micro LEDs 41 on the supply substrate 10 so as to have all the micro LEDs to be transferred separated from the supply substrate 10 and fixed to the monochromic pixel zone that corresponds to the selected color to complete making of the monochromic micro LED array of the color.

Figure 5:
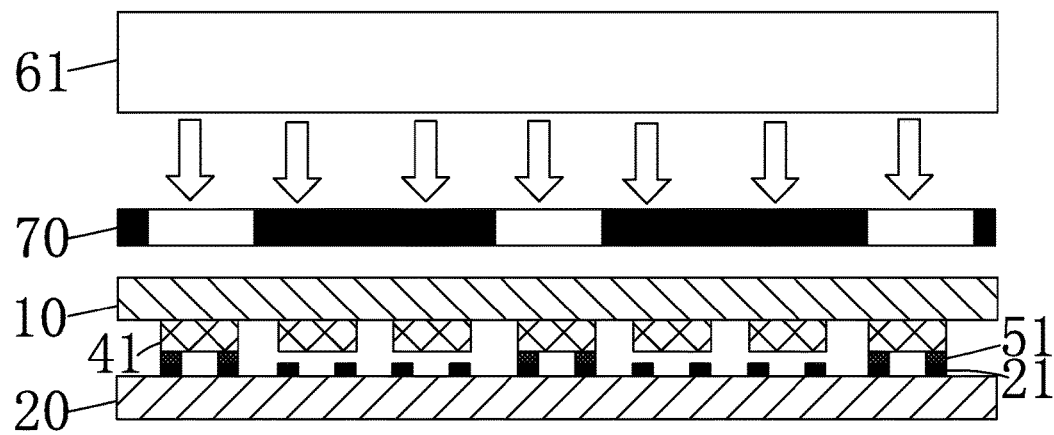
FIG. 5 is a schematic view illustrating selective irradiation conducted on multiple micro LEDs by using a large-area laser source in combination with a mask plate in Step S3 of FIG. 4.
Figure 6:
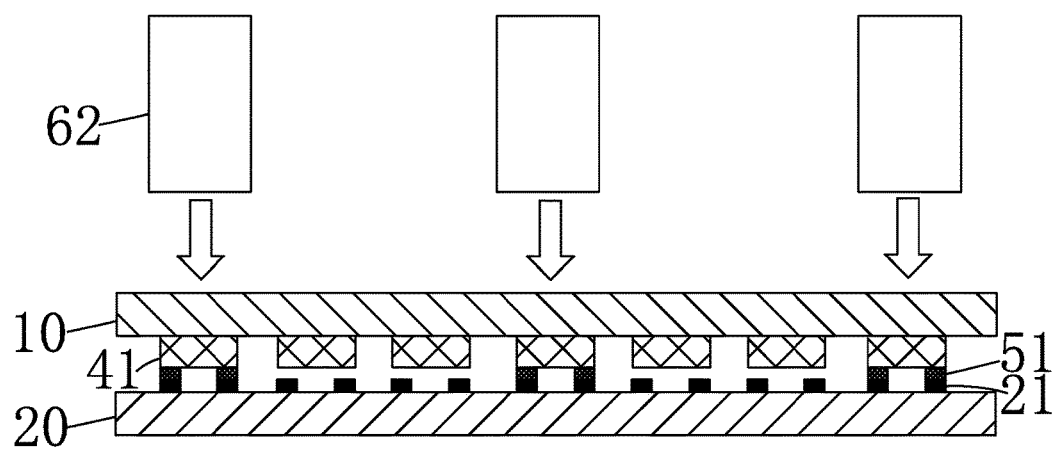
FIG. 6 is a schematic view illustrating selective irradiation conducted on multiple micro LEDs by using multiple fixed-direction laser sources in Step S3 of FIG. 4.

Specifically, as shown in FIG. 5, in Step S3, a large-area laser source 61 is used, in combination with a mask plate 70 to subject the plurality of micro LEDs 41 to selective irradiation, so that only the micro LEDs to be transferred are subjected to laser irradiation. Or, alternatively, as shown in FIG. 6, in Step S3, a plurality of fixed-direction laser sources 62 having good directionality and small light spot are used to subject the plurality of micro LEDs 41 to selective irradiation, and specifically, the plurality of fixed-direction laser sources 62 are set to correspond to the micro LEDs to be transferred of the supply substrate 10 so that only the micro LEDs to be transferred are subjected to laser irradiation.

Specifically, in Step S3, laser irradiation can be conducted from the supply substrate 10 side or from the receiving substrate 20 side onto the micro LEDs to be transferred and no specific limitations are made herein.

Specifically, in the method for manufacturing a color micro LED array substrate according to the present invention, the monochromic micro LED arrays of the different colors are made, in sequence, on the color micro LED array substrate and a sum of a thickness of the metal electrodes 51 of one monochromic micro LED array that is made posteriorly and a height of the driving electrodes 21 of the receiving substrate 20 corresponding thereto is made greater than a height of an anteriorly formed monochromic micro LED array on the receiving substrate 20 so that the anteriorly formed monochromic micro LED array does not interfere with the coupling of the metal electrodes 51 of the posteriorly formed the monochromic micro LED array with the corresponding driving electrodes 21.

Specifically, the receiving substrate 20 can be a thin-film transistor (TFT) array substrate so that the receiving substrate 20, after completion of the formation of the monochromic micro LED arrays of all the different colors, is applicable to manufacturing a color micro LED display for color displaying.

The method for manufacturing a color micro LED array substrate of the present invention involves making a plurality of monochromic micro LED arrays of different colors on a receiving substrate 20 to form a color micro LED array, wherein making of the monochromic micro LED array of each of the colors is conducted in combination with a bonding technique and a laser separation technique and metal electrodes 52 are selectively formed on the micro LEDs 41 in a specific zone of the supply substrate 10 so that the micro LEDs 41 in the specific zone can be selectively bonded to the receiving substrate 20 and laser irradiation is selectively made on the micro LEDs 41 in the specific zone to allow the micro LEDs 41 of the specific zone, after the bonding and laser annealing, to separate from the supply substrate 10 to thereby form the monochromic micro LED array on the receiving substrate 20 to realize fabrication of monochromic micro LED arrays of different colors on the receiving substrate 20, and the method of fabrication is easy to carry out.

Figure 7:
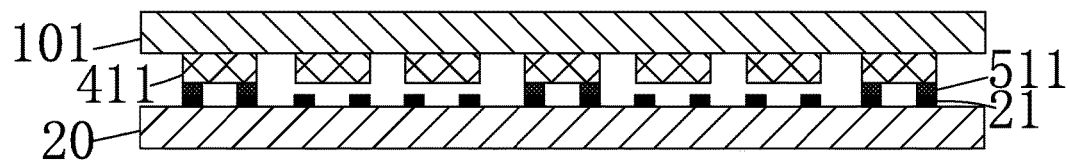
FIG. 7 is a schematic view illustrating Step S10 of a preferred embodiment of the method for manufacturing a color micro LED array substrate according to the present invention.

Specifically, in a preferred embodiment of the method for manufacturing a color micro LED array substrate according to the present invention, the receiving substrate 20 comprises three monochromic pixel zones, and the three monochromic pixel zones are respectively red, green, and blue pixel zones. Correspondingly, the color micro LED array comprises three monochromic micro LED arrays of different colors and the three monochromic micro LED arrays are respectively red, green, and blue micro LED arrays. The preferred embodiment may specifically comprises the following steps:

Step S10: as shown in FIG. 7, providing a first supply substrate 101 corresponding to blue color and a receiving substrate 20, wherein the first supply substrate 101 is provided thereon with a plurality of blue micro LEDs 411; defining a to-be-transferred zone on the first supply substrate 101 to correspond to a blue pixel zone of the receiving substrate 20 and defining the blue micro LEDs 411 in the to-be-transferred zone of the supply substrate 101 as blue micro LEDs to be transferred, and forming first metal electrodes 511 on each of the blue micro LEDs to be transferred; and, then, aligning the first supply substrate 101 and the receiving substrate 20 with each other such that the first metal electrodes 511 of each of the blue micro LEDs to be transferred are positioned above and corresponding to the driving electrodes 21 of the blue pixel zone of the receiving substrate 20 to allow the first metal electrodes 511 of each of the blue micro LEDs to be transferred to correspond to and couple to the driving electrodes 21 so as to have the blue micro LEDs to be transferred bonded to the blue pixel zone of the receiving substrate 20 to complete fabrication of a blue micro LED array on the receiving substrate 20.

Figure 8:
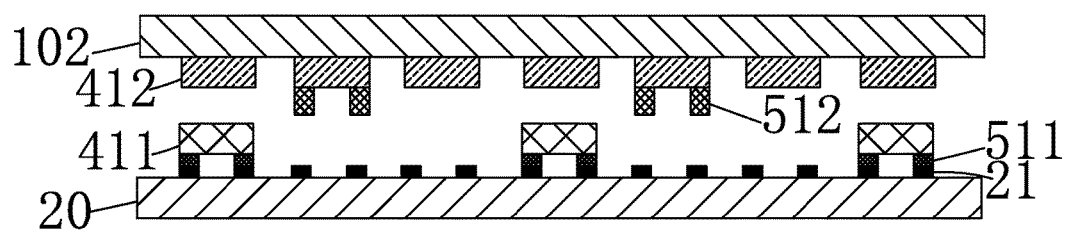
FIG. 8 is a schematic view illustrating Step S20 of the preferred embodiment of the method for manufacturing a color micro LED array substrate according to the present invention.

Step S20: as shown in FIG. 8, providing a second supply substrate 102 corresponding to red color, wherein the second supply substrate 102 is provided thereon with a plurality of red micro LEDs 412; defining a to-be-transferred zone on the second supply substrate 102 to correspond to a red pixel zone of the receiving substrate 20 and defining the red micro LEDs 412 in the to-be-transferred zone of the supply substrate 102 as red micro LEDs to be transferred, and forming second metal electrodes 512 on each of the red micro LEDs to be transferred; and, then, aligning the second supply substrate 102 and the receiving substrate 20 with each other such that the second metal electrodes 512 of each of the red micro LEDs to be transferred are positioned above and corresponding to the driving electrodes 21 of the red pixel zone of the receiving substrate 20 to allow the second metal electrodes 512 of each of the red micro LEDs to be transferred to correspond to and couple to the driving electrodes 21 so as to have the red micro LEDs to be transferred bonded to the red pixel zone of the receiving substrate 20 to complete fabrication of a red micro LED array on the receiving substrate 20.

Figure 9:
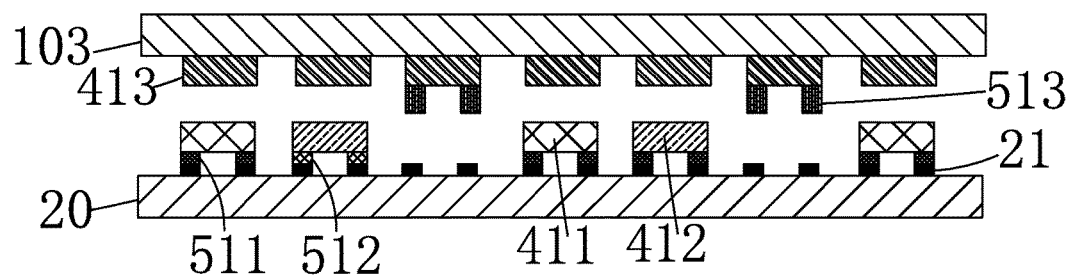
FIG. 9 is a schematic view illustrating Step S30 of the preferred embodiment of the method for manufacturing a color micro LED array substrate according to the present invention.

Step S30: as shown in FIG. 9, providing a third supply substrate 103 corresponding to green color, wherein the third supply substrate 103 is provided thereon with a plurality of green micro LEDs 413; defining a to-be-transferred zone on the third supply substrate 103 to correspond to a green pixel zone of the receiving substrate 20 and defining the green micro LEDs 413 in the to-be-transferred zone of the supply substrate 103 as green micro LEDs to be transferred, and forming third metal electrodes 513 on each of the green micro LEDs to be transferred; and, then, aligning the third supply substrate 103 and the receiving substrate 20 with each other such that the third metal electrodes 513 of each of the green micro LEDs to be transferred are positioned above and corresponding to the driving electrodes 21 of the green pixel zone of the receiving substrate 20 to allow the third metal electrodes 513 of each of the green micro LEDs to be transferred to correspond to and couple to the driving electrodes 21 so as to have the green micro LEDs to be transferred bonded to the green pixel zone of the receiving substrate 20 to complete fabrication of a green micro LED array on the receiving substrate 20 to form a color micro LED array substrate.

In summary, the present invention provides a method for manufacturing a color micro LED array substrate, in which a plurality of monochromic micro LED arrays of different colors are formed on a receiving substrate to form a color micro LED array, wherein making of the monochromic micro LED array of each of the colors is conducted in combination with a bonding technique and a laser lift-off technique and metal electrodes are selectively formed on the micro LEDs in a specific zone of the supply substrate so that the micro LEDs in the specific zone can be selectively bonded to the receiving substrate and laser irradiation is selectively made on the micro LEDs in the specific zone to allow the micro LEDs of the specific zone, after the bonding and laser annealing, to separate from the supply substrate to thereby form the monochromic micro LED array on the receiving substrate to realize fabrication of monochromic micro LED arrays of different colors on the receiving substrate, and the method of fabrication is easy to carry out.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A method for manufacturing a color micro light-emitting diode (LED) array substrate, wherein the color micro LED array substrate comprises a receiving substrate and a color micro LED array arranged on the receiving substrate; the receiving substrate comprises a plurality of monochromic pixel zones respectively corresponding to different colors, the color micro LED array comprising a plurality of monochromic micro LED arrays of different colors, the monochromic micro LED array of each of the colors being arranged in one of the monochromic pixel zones corresponding to the color;

wherein a process for making the monochromic micro LED array of each color of the color micro LED array substrate comprises the following steps:

Step S1: providing a supply substrate corresponding to a selected color and a receiving substrate, wherein the supply substrate is provided with a plurality of micro LEDs of the selected color; defining a to-be-transferred zone on the supply substrate to correspond to the monochromic pixel zone of the receiving substrate that corresponds to the selected color and defining the micro LEDs located in the to-be-transferred zone of the supply substrate as micro LEDs to be transferred, and forming metal electrodes on each of the micro LEDs to be transferred, wherein each of the monochromic pixel zones of the receiving substrate is provided with a plurality of driving electrodes;

Step S2: aligning the supply substrate and the receiving substrate with each other such that the metal electrodes of each of the micro LEDs to be transferred are positioned above and corresponding to the driving electrodes in the monochromic pixel zone of the receiving substrate corresponding to the selected color to allow the metal electrodes of each of the micro LEDs to be transferred to couple to the driving electrodes so as to have the micro LED to be transferred bonded to the monochromic pixel zone of the receiving substrate that corresponds to the selected color; and Step S3: conducting laser irradiation on all the micro LEDs to be transferred among the plurality of micro LEDs on the supply substrate so as to have all the micro LEDs to be transferred separated from the supply substrate and fixed to the monochromic pixel zone that corresponds to the selected color to complete making of the monochromic micro LED array of the color.

2. The method for manufacturing a color micro LED array substrate as claimed in claim 1, wherein in Step S3, a large-area laser source is used, in combination with a mask plate to subject the plurality of micro LEDs to selective irradiation, so that only the micro LEDs to be transferred are subjected to laser irradiation.

3. The method for manufacturing a color micro LED array substrate as claimed in claim 1, wherein in Step S3, a plurality of fixed-direction laser sources are used to subject the plurality of micro LEDs to selective irradiation, wherein the plurality of fixed-direction laser sources are set to correspond to the micro LEDs to be transferred of the supply substrate so that only the micro LEDs to be transferred are subjected to laser irradiation.

4. The method for manufacturing a color micro LED array substrate as claimed in claim 1, wherein in Step S1, a photolithographic operation is applied to form the metal electrodes on each of the micro LEDs to be transferred.

5. The method for manufacturing a color micro LED array substrate as claimed in claim 1, wherein in Step S2, the plurality of driving electrodes are provided thereon with low melting point solder pads.

6. The method for manufacturing a color micro LED array substrate as claimed in claim 5, wherein in Step S2, a process for bonding the micro LED to be transferred to the receiving substrate comprises: with the micro LED to be transferred being positioned on the driving electrodes, implementing heating treatment to have the low melting point solder pads of the driving electrodes melted so as to couple the metal electrodes of the micro LED to be transferred to the driving electrodes thereby bonding the micro LED to be transferred to the monochromic pixel zone of the receiving substrate that corresponds to the selected color.

7. The method for manufacturing a color micro LED array substrate as claimed in claim 1, wherein the monochromic micro LED arrays of the different colors are sequentially formed on the color micro LED array substrate;

wherein a sum of a thickness of the metal electrodes of one of the monochromic micro LED arrays that is made posteriorly and a height of the driving electrodes of the receiving substrate corresponding thereto is made greater than a height of one of the monochromic micro LED arrays that is formed anteriorly on the receiving substrate.

8. The method for manufacturing a color micro LED array substrate as claimed in claim 1, wherein in Step S3, laser irradiation is conducted from the supply substrate side or from the receiving substrate side onto the micro LEDs to be transferred.

9. The method for manufacturing a color micro LED array substrate as claimed in claim 1, wherein the receiving substrate comprises three monochromic pixel zones, and the three monochromic pixel zones are respectively red, green, and blue pixel zones, the color micro LED array correspondingly comprising three monochromic micro LED arrays of different colors, the three monochromic micro LED arrays being respectively red, green, and blue micro LED arrays.

10. The method for manufacturing a color micro LED array substrate as claimed in claim 1, wherein the receiving substrate comprises a thin-film transistor (TFT) array substrate.

11. A method for manufacturing a color micro light-emitting diode (LED) array substrate, wherein the color micro LED array substrate comprises a receiving substrate and a color micro LED array arranged on the receiving substrate; the receiving substrate comprises a plurality of monochromic pixel zones respectively corresponding to different colors, the color micro LED array comprising a plurality of monochromic micro LED arrays of different colors, the monochromic micro LED array of each of the colors being arranged in one of the monochromic pixel zones corresponding to the color;

wherein a process for making the monochromic micro LED array of each color of the color micro LED array substrate comprises the following steps:

Step S1: providing a supply substrate corresponding to a selected color and a receiving substrate, wherein the supply substrate is provided with a plurality of micro LEDs of the selected color; defining a to-be-transferred zone on the supply substrate to correspond to the monochromic pixel zone of the receiving substrate that corresponds to the selected color and defining the micro LEDs located in the to-be-transferred zone of the supply substrate as micro LEDs to be transferred, and forming metal electrodes on each of the micro LEDs to be transferred, wherein each of the monochromic pixel zones of the receiving substrate is provided with a plurality of driving electrodes;

Step S2: aligning the supply substrate and the receiving substrate with each other such that the metal electrodes of each of the micro LEDs to be transferred are positioned above and corresponding to the driving electrodes in the monochromic pixel zone of the receiving substrate corresponding to the selected color to allow the metal electrodes of each of the micro LEDs to be transferred to couple to the driving electrodes so as to have the micro LED to be transferred bonded to the monochromic pixel zone of the receiving substrate that corresponds to the selected color; and Step S3: conducting laser irradiation on all the micro LEDs to be transferred among the plurality of micro LEDs on the supply substrate so as to have all the micro LEDs to be transferred separated from the supply substrate and fixed to the monochromic pixel zone that corresponds to the selected color to complete making of the monochromic micro LED array of the color;

wherein in Step S1, a photolithographic operation is applied to form the metal electrodes on each of the micro LEDs to be transferred; and wherein in Step S2, the plurality of driving electrodes are provided thereon with low melting point solder pads.

12. The method for manufacturing a color micro LED array substrate as claimed in claim 11, wherein in Step S3, a large-area laser source is used, in combination with a mask plate to subject the plurality of micro LEDs to selective irradiation, so that only the micro LEDs to be transferred are subjected to laser irradiation.

13. The method for manufacturing a color micro LED array substrate as claimed in claim 11, wherein in Step S3, a plurality of fixed-direction laser sources are used to subject the plurality of micro LEDs to selective irradiation, wherein the plurality of fixed-direction laser sources are set to correspond to the micro LEDs to be transferred of the supply substrate so that only the micro LEDs to be transferred are subjected to laser irradiation.

14. The method for manufacturing a color micro LED array substrate as claimed in claim 11, wherein in Step S2, a process for bonding the micro LED to be transferred to the receiving substrate comprises: with the micro LED to be transferred being positioned on the driving electrodes, implementing heating treatment to have the low melting point solder pads of the driving electrodes melted so as to couple the metal electrodes of the micro LED to be transferred to the driving electrodes thereby bonding the micro LED to be transferred to the monochromic pixel zone of the receiving substrate that corresponds to the selected color.

15. The method for manufacturing a color micro LED array substrate as claimed in claim 11, wherein the monochromic micro LED arrays of the different colors are sequentially formed on the color micro LED array substrate;

wherein a sum of a thickness of the metal electrodes of one of the monochromic micro LED arrays that is made posteriorly and a height of the driving electrodes of the receiving substrate corresponding thereto is made greater than a height of one of the monochromic micro LED arrays that is formed anteriorly on the receiving substrate.

16. The method for manufacturing a color micro LED array substrate as claimed in claim 11, wherein in Step S3, laser irradiation is conducted from the supply substrate side or from the receiving substrate side onto the micro LEDs to be transferred.

17. The method for manufacturing a color micro LED array substrate as claimed in claim 11, wherein the receiving substrate comprises three monochromic pixel zones, and the three monochromic pixel zones are respectively red, green, and blue pixel zones, the color micro LED array correspondingly comprising three monochromic micro LED arrays of different colors, the three monochromic micro LED arrays being respectively red, green, and blue micro LED arrays.

18. The method for manufacturing a color micro LED array substrate as claimed in claim 11, wherein the receiving substrate comprises a thin-film transistor (TFT) array substrate.

* * * * *